United States Patent [19]

Schneider

[11] Patent Number: 4,611,124

[45] Date of Patent: Sep. 9, 1986

[54] FLY'S EYE SENSOR NONLINEAR SIGNAL PROCESSING

[75] Inventor: Richard T. Schneider, Gainesville, Fla.

[73] Assignee: The United States of America as represented by the Secretary of the Air Force, Washington, D.C.

[21] Appl. No.: 620,211

[22] Filed: Jun. 13, 1984

[51] Int. Cl.⁴ ................................................ H01J 40/14
[52] U.S. Cl. ................................ 250/578; 250/211 J; 350/167
[58] Field of Search .................. 250/211 J, 227, 578; 350/167; 358/212, 213

[56] References Cited

U.S. PATENT DOCUMENTS

| | | | |
|---|---|---|---|
| 3,127,594 | 3/1964 | Roe et al. | 340/203 |
| 3,313,939 | 4/1967 | Spencer | 250/212 |
| 3,537,091 | 10/1970 | Schenkenberg | 340/239 |
| 3,786,263 | 1/1974 | Michon | 250/211 J X |
| 3,789,194 | 1/1974 | Kirby | 235/92 PK |
| 3,944,813 | 3/1976 | Fowler | 250/205 |
| 4,074,128 | 2/1978 | Harris, Jr. | 250/205 |
| 4,347,439 | 8/1982 | Wood et al. | 250/222 R |
| 4,384,194 | 5/1983 | Jones | 377/8 |

Primary Examiner—Eugene R. LaRoche
Assistant Examiner—James C. Lee
Attorney, Agent, or Firm—Donald J. Singer; Gerald B. Hollins

[57] ABSTRACT

Multiaperture fly's eye optical signal transducing apparatus employing nonlinear electrical signal processing located adjacent the optical transducers in a multifunction integrated circuit device. The processed signals have enhanced low-level contrast and attenuated high contrast. Utilization examples, mathematical equations and related characteristic curves are also included along with exemplary circuit diagrams.

15 Claims, 8 Drawing Figures

TIME REQUIRED TO REACH $U_s = 1mV$

FLY'S EYE SENSOR NONLINEAR SIGNAL PROCESSING

RIGHTS OF THE GOVERNMENT

The invention described herein may be manufactured and used by or for the Government of the United States for all governmental purposes without the payment of any royalty.

CROSS REFERENCE TO RELATED APPLICATIONS

This application is related to two copending applications titled "Integrated Multiaperture Optical System", Ser. No. 475,676, filed Mar. 15, 1983, and "High Efficiency Fiber-Shaped Detector", Ser. No. 555,803, filed Nov. 28, 1983, herein called my copending applications.

BACKGROUND OF THE INVENTION

This invention relates to the field of nonlinear electronic processing of light image data collected by an optical viewing system; light in this context is meant to include electromagnetic energy in the ultraviolet, visible and infrared spectral ranges.

Optical systems having electrical output signals are employed in object detection, television, pattern recognition, and other present-day electronic systems. Usually in these systems a small area light to electrical transducer element is exposed to a precisely defined portion of the incident radiation in order to provide an electrical signal which represents a small area in a viewed scene. Exposures of this type are repeated a plurality of times in either a parallel or serial exposure arrangement to obtain a complete electrical representation of the viewed scene. In many such present-day systems, it is common to transmit the electrical signal from an exposed transducer over a considerable distance before performing initial electrical signal processing operations.

Some modern military optical-electronic systems are finding it desirable to combine these optical sensing and initial electronic signal processing operations into a single module of considerably increased capability in comparison with prior sensor and initial processing devices. Modules of this type are frequently constructed on an integral circuit substrate which is used both to contain the electronic processing circuitry and to support the optical transducer array. Such arrangements are found to be especially useful in smart weapons such as guided missiles and bombs where the module characteristics are also dictated by a combination of small physical space, strenuous physical environment, nonlinear electrical properties and nontaxing image quality requirements. A discussion of the sensor needs and combination optic and transducer arrangements appropriate for such weapons is contained in my above referenced and copending first and second patent applications, Ser. Nos. 475,676 and 555,803, respectively. The disclosure of these two applications is hereby incorporated by reference into the present specification.

The U.S. Patent art includes examples of nonlinear signal processing systems of the separate sensor and processing type used for a variety of purposes. One such prior patent, U.S. Pat. No. 3,313,939, is issued to Herbert C. Spencer of Taplow, England and concerns an apparatus which senses the amount of sunlight received by garden plants in order that a correlation between sunlight dosage and artificial watering of the exposed plants be achieved. The Spencer invention includes electronic processing of optically generated electrical signals and includes the accummulation of an electric charge representing sunlight intensity and duration on a capacitor element together with the concepts of discharging the capacitor upon attainment of a predetermined voltage and counting the number of discharge occurrences in a predetermined time interval. In the Spencer invention plant watering is commenced upon attainment of a preselected number of capacitor discharge events.

The Spencer apparatus employs separate light-sensing and electronic processing structures and is limited to a single channel of optical and electronic signals. The light sensor in this apparatus is a conventional device of the planar solar cell variety. The Spencer apparatus is unconcerned with the rate of information accummulation or the mathematical relationship between input radiation rate and the time of attaining water valve turn-on, that is, with the input to output algorithm achieved in the electronic signal processing. The Spencer apparatus is, of course, concerned with long-time intervals and employs correspondingly large electrical components of the discrete component type in achieving the light signal processing. The possibilities of integrated circuit fabrication, numerous signal processing channels, and nonlinear input-to-output relationship as might be required in an imaging system is not considered in the Spencer patent.

SUMMARY OF THE INVENTION

An object of the present invention is to provide a multiapertured image transducer and processor apparatus.

Another object of the invention is to provide a multichanneled image processing system wherein a portion of the electrical image processing is accomplished close to the optical-to-electrical transducer element.

Another object of the invention is to provide a multichannel imaging apparatus which incorporates the nonlinear processing needed in a large-dynamic signal range environment.

Another object of the invention is to provide an optical signal processing arrangement which is readily adapted for use in bio systems.

The invention involves a multiple lense fly's eye detector apparatus which includes an optical-to-electrical sensor array having a first plurality of solid state transducer cells that are each coupled optically with one of the lense elements. Each transducer cell in turn contains a plurality of transducer elements. The cells of elements are located in the focal plane of the optical lenses and function to generate optically related signals. The transducer elements are each electrically coupled with a logarithmic signal correlating circuit that is located adjacent the transducer elements in an integrated circuit structure. Each correlating circuit includes an electrical storage circuit that accumulates electrical energy at a rate which depends on the light received by its lense element and the energy accumulating time constant of the storage circuit. The storage circuit is relieved of its accumulated electrical energy wherever it reaches a predetermined quantity, the relieving event requiring a period of time which is determined by a relieving time constant that is shorter than the accumulating time constant. The number of relieving events occurring during a selected time interval is counted and is used as a measure of the light impinging on the transducer's lense according to a nonlinear relationship.

DETAILED DESCRIPTION

Figure 1:
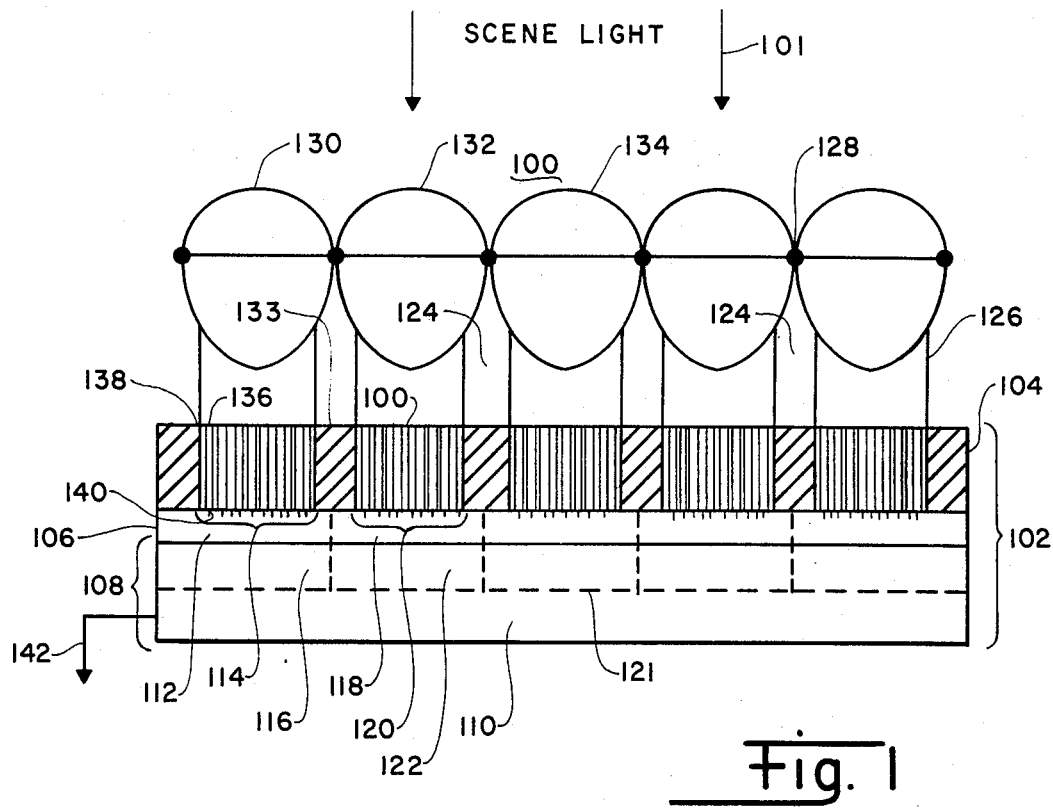
FIG. 1 is a cross-sectional view of a fly's eye sensor.

In the drawings, the FIG. 1 cross-sectional view shows several details of a fly's eye multiaperture optical sensor which might find use in the target detecting and guidance system of heat-seeking or terrain following missiles. Sensors of this type may also be used in map making, night vision infrared devices, character recognition systems, bio systems and in other optical-to-electrical transducer applications. The FIG. 1 sensor is shown enlarged several times in comparison with the actual size needed for meaningful resolution of most viewed scenes.

The FIG. 1 sensor includes a lens array 100 which is optically coupled to a transducer and signal processing device 102 that in turn ultimately provides one or more electrical output signals on a signal bus 142. A useful embodiment of the FIG. 1 sensor would, of course, employ either a two-dimensional matrix of transducer cells to form a light-sensitive retina or else employ a single row of transducer cells with some form of image scanning movement. Depending upon the environment and materials employed, the FIG. 1 sensor may employ cooling flow in the cavities 124 between lenses and lense supports in order that the transducer cells and the electronic circuits have stable and predictably thermal characteristics.

The lens array 100 in FIG. 1 includes a plurality of individual lens elements 130, 132 and 134, which are adapted to transmit light 101 from the scene to be viewed. The lens array 100 also includes a plurality of optical coupling tubular supports 126 for transmitting light energy between individual lens elements and the transducer layer 104 in the device 102. These tubular support members may be hollow cylinders or filled with fiber optic materials or other light-transmitting media known in the optical art. The lens array also includes the plurality of cavities or channels 124 encompassing the space between lenses and tubular supports and usable as indicated above for transmitting the gaseous or liquid cooling fluids which may be needed in applications such as infrared sensing in order that the transducer cells, tubular supports, and lenses be maintained at a desirable low and fixed temperature. The cooling fluid can be retained by a network of fluid seals indicated at 128 and located in the space between adjacent lens elements.

The transducer and processing device 102 is comprised of three layers, an optical-to-electrical transducer layer or detector layer 104, a signal correlation layer 106 and a signal processing layer 108. As described in my first and second copending patent applications, identified above, the transducer layer 104 (which is therein called the focal plane detector) preferably contains a plurality of individual transducer elements, which are grouped into cells or bundles; typically one-hundred elements are employed in each cell or bundle and one cell or bundle is employed for each of the lenses 130, 132 in order that meaningful resolution of the image presented by each lense be achieved. The electrical signal produced by each of these transducer elements is individually amplified and processed by electrical circuitry which is described subsequently herein and is located in the correlation layer 106 immediately beneath the related transducer and lense elements. This processing includes nonlinear analog to digital conversion of the transducer element electrical signal and storage of the converted signal in a first memory element M1, 224 in FIG. 2 which is also provided on a one memory element for each transducer element basis.

A preferred arrangement for the individual transducer elements in the transducer layer 104 is shown and described in connection with FIG. 6 of my first and FIG. 3 of my second copending patent applications. In these descriptions the transducer elements are called detector elements. Generally, these transducer elements are comprised of cylindrically shaped light transparent fibers of about 100 micrometers diameter and have a plurality of added concentric layers on the exterior of the fibers. The added layers include a photosensitive layer which is covered successively with a transparent insulation layer and a reflective layer. During operation of these transducer elements, light enters an end of the transparent fiber and reflects between sides of the fiber a number of times in a diagonal pattern which extends down the fiber length. At each reflection point some light also passes through the fiber wall and impinges on the photosensitive layer. Light passing through the photosensitive layer is reflected back toward the fiber by the reflective layer for another impingement on the photosensitive layer and re-entry of the fiber.

A great number of these fiber transducer elements are adhered together to form each cell or bundle and a number of cells or bundles are collected to form the retina or transducer layer 104. The electrical signal output of each fiber transducer element is individually coupled to an amplifier and nonlinear processing circuit of the type described below in preference to the generally described amplifier and analog-to-digital converter in my above referenced copending patent applications. The circuitry which comprises both this nonlinear processing and the correlating layer memory element associated with each transducer element may be fabricated according to the techniques employed in the integrated circuit art. These techniques include the use of standard cell circuits which are repeated once for each transducer element in a computer aided design layout of the correlation layer 106. The array of these standard cell circuits which process the signal from the first lense element 130 is in turn repeated for each of the other lense elements 132,134, etc.

The individual fiber transducer elements are indicated generally at 136 in FIG. 1. The boundary between the many transducer elements used with one lense element and a transducer housing structure 133 is shown at 138 in FIG. 1. The transducer elements are arranged in a generally circular or cylindrical bundle 114,120 which receives light through the tubular support members 126 and the lense elements 130, 132, 134, etc. The electrical signal output of the transducer elements in the bundle 114 is indicated by the conductors 140, there being one electrical output signal from each fiber transducer element.

The electrical signal output on each of the conductors 140 is coupled to a correlation layer 106 circuit of the type described below; the correlation layer circuits for the signals originating in each lense element are generally clustered together in groups as indicated at 112 and 118. The combination of a transducer element and the electronic circuitry which processes the signal generated by that element is named a channel herein.

The channel processing circuits indicated in 116 and 122 as portions of the processing layer 108 may also be fabricated as standard integrated circuit cells which repeat for each transducer cell and lense element.

Figure 2:
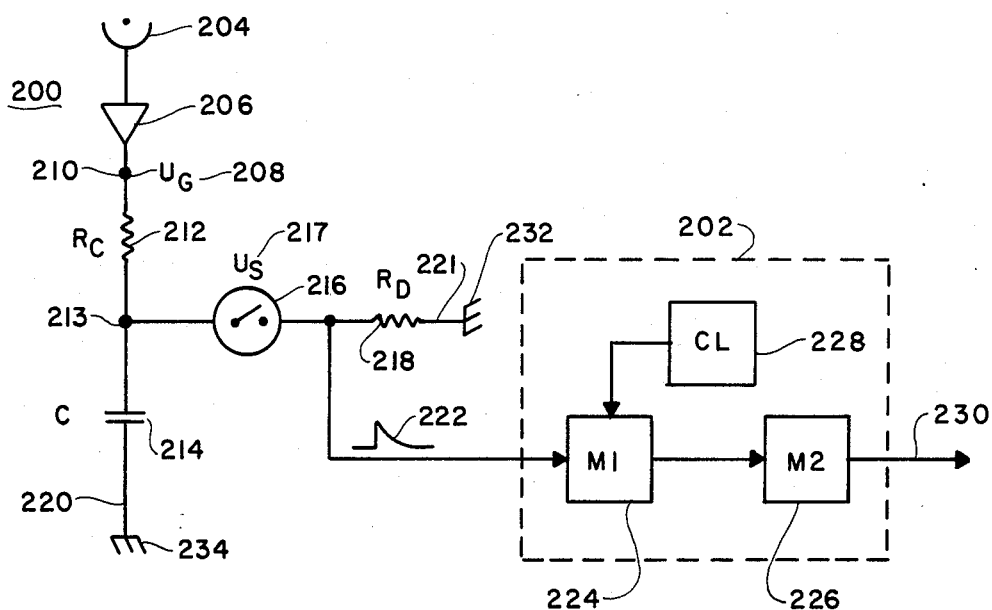
FIG. 2 is a symbolic schematic diagram of an electronic processing system usable with the FIG. 1 system.

These processing circuits include a second memory shown as M2, 226 in FIG. 2 which receives information selectively from each of the correlation layer memories in response to a clock signal. Operation of the memories M1, and M2 (224 and 226 in FIG. 2) assumes that each pulse 222 will enter a count of one in memory M1 and that a pulse from the clock circuit CL, 238 will transfer the accumulated number in the memory M1 to memory M2 at a predetermined time and will also reset M1 to zero. The memory M2 is connected to subsequent logic circuits for utilization of the accumulated information.

The barrier 121 in the signal processing layer 108 indicates generally that some circuitry following the individual processing circuits 116 and 118 is involved in producing the output provided on the signal bus 142. In lieu of the layered arrangement shown at 106 and 108 in FIG. 1 and the barrier arrangement at 121 it is, of course, possible to locate these electrical circuits in horizontally displaced clusters on a single layer of circuitry if desired. For purposes of clarification, it should be noted that the processing layer 108 in FIG. 1 is called the programming layer in my above identified second copending application.

Circuitry which is includable in the signal correlation layer 106 in FIG. 1 and which provides the initial electrical processing of signals originating in each photosensitive transducer element 136 is indicated in the functional schematic diagram of FIG. 2. The FIG. 2 functional schematic diagram broadly includes the transducer and its related analog circuitry 200 and a pulse counting apparatus 202; together these elements cooperate to provide periodically updated numeric values on an output conductor 230, these numeric values are controlled by the frequency at which discharge signal pulses 222 are developed by the transducer and transducer readout apparatus 200 in response to light or radiation received at the transducer element 204. The transducer element 204 corresponds to the transducer elements 136 in FIG. 1.

The FIG. 2 apparatus includes a transducer signal amplifier 206, a first signal node 210 which is driven by the $U_o$ output of the amplifier 206, an information storing capacitor 214, and a capacitor charging resistor $R_c$, 212. Also included in the FIG. 2 apparatus are an electronic switch indicated symbolically at 216, a circuit node 213 and located on one side of the capacitor 214, and a capacitor discharging resistance $R_d$, 218. A capacitor discharge signal pulse 222 is shown to be developed across the resistor 218 in FIG. 2. A counter 202 for the signal pulses 222 in FIG. 2 includes the above mentioned first and second memories 224,226 and clocking circuit 228. The lower end of the resistor 218 is shown connected to a common return or ground terminal 232 as is also the capacitor discharging conductor 220.

During operation of the FIG. 2 circuit it is contemplated that light-dependent signal at the node 210 will cause charging of the capacitor 214 at a charging rate that is dependent on the electrical time constant $T_c$ mathematically defined by the product of the electrical values of resistor 212 and capacitor 214. Operation of the FIG. 2 apparatus further contemplates that when the voltage across capacitor 214 reaches some predetermined level the electronic switch 216 will close and a capacitor discharging current will flow in the resistor 218. The time constant of the capacitor discharge is determined by the electrical values of the capacitor 214 and the resistor 218 and is desirably made shorter than the above described charging time constant; that is, the resistor 218 has a value lower than that of the resistor 212. Current flowing in the resistor 218 during the discharge of the capacitor 214 generates a voltage across this resistor which has a waveform generally as indicated by the pulse 222.

During charging of the capacitor 214 by current in the resistor 212, a charging path return is needed, such a return is established by the conductor 220 and the ground connection 234. In similar fashion, during discharging of the capacitor 214 by current in the resistor 218, a current return path is needed from the node 213 and is established by conductor 221 and the ground connection 232. One practical arrangement for achieving the charging and discharging of the capacitor 214 and the current paths 220 and 221 is shown in FIG. 5 of the drawings and is described in connection therewith.

A voltage across the capacitor 214 which is just adequate to initiate a conduction event in the electronic switch 216 is identified at 217 as the voltage $U_s$; closure of the switch 216 once initiated is maintained until a voltage of zero is obtained across the capacitor 214. The switch 216 exists in the high impedance or open condition until the voltage $U_s$, 217, is attained across the capacitor 214; the voltage across the switch 216 is zero or of neglible amplitude in comparison with the voltage across the resistor 218 during capacitor discharge. Since the voltage across capacitor 214 to initiate closure of the switch 216 is always of the same magnitude the amplitude of the pulse 222 is the same for each pulse occurrence.

The voltage appearing across the capacitor 214 at any time t following the initiation of capacitor charging is predicted by the equation $$U(t) = U_o\left(1 - e^{\frac{-t}{T_c}}\right)$$

where
U(t) is the capacitor voltage at time t and
$U_o$ is the charging voltage, 208 in FIG. 2 and
e is the base of the naperian logarithm and
$T_c$ is the time constant of the resistor $R_c$, 212 and the capacitor 214, i.e. $T_c = C \times Rc$.

The time $t_s$ required to reach the switch closing voltage $U_s$ depends on the magnitude of $U_o$ and is given by the equation $$t_s = T_c \times \ln\left(\frac{U_o}{U_o - U_s}\right) \tag{2}$$

Figure 6:
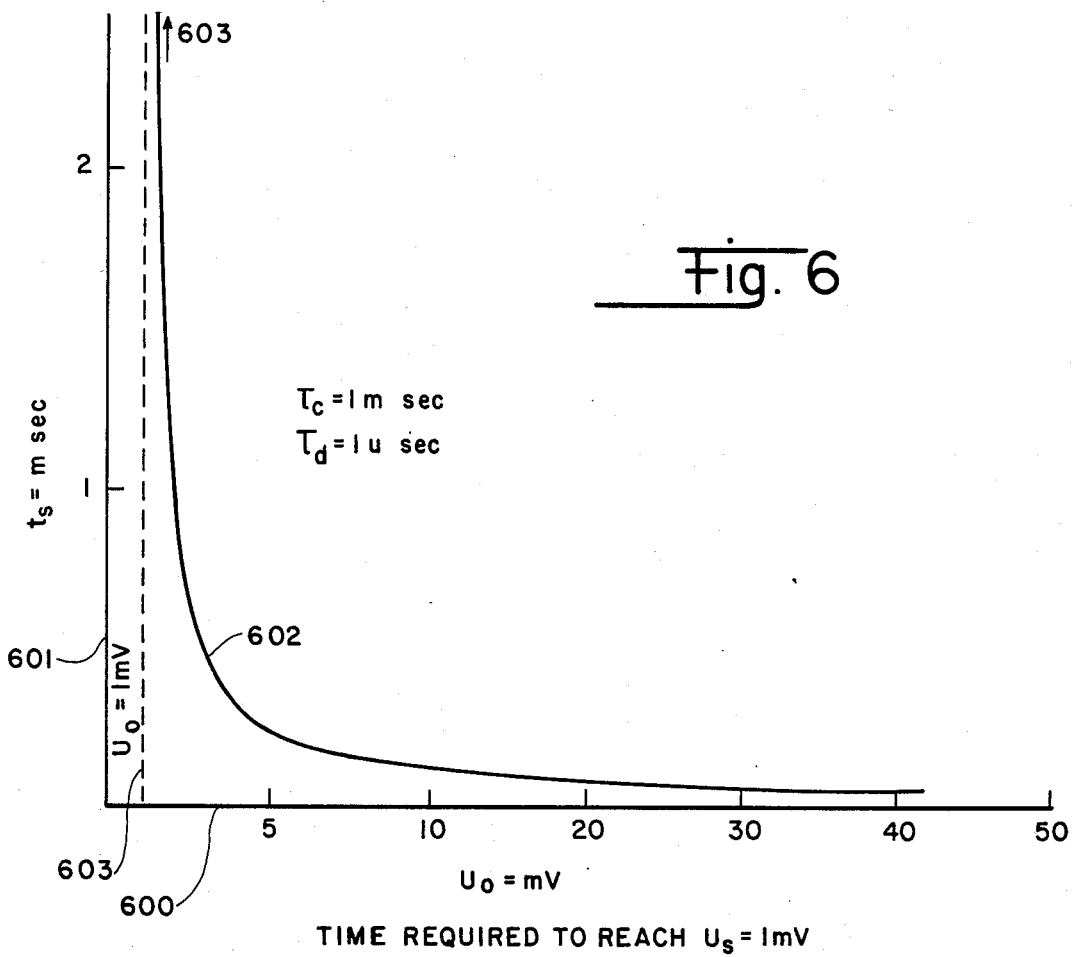
FIG. 6 shows a capacitor charging time relationship useful in understanding operation of the invention.

FIG. 6 shows as an example a plot of the time required to reach a value $U_s=1$ mV as a function of charging voltage $U_o$. In FIG. 6 the horizontal axis 600 indicates $U_o$ values in millivolts, the vertical axis 601 indicates $t_s$ time values in milliseconds, the plot 602 represents the $U_o,t_s$ relationship and the number 603 represents the asymptote of the plot 602. As can be seen in the FIG. 6 plot, if $U_o$ is less than $U_s$ the voltage $U_s$ is never reached across the capacitor 214 and the time required to charge to this value would be infinity is as shown by the asymptote 603. If $U_o$ is greater than $U_s$ the time required to reach $U_s$ has a logarithmic relationship with $U_o$. E.G., if $U_s=1$ mV, $T_c=1$ mSec and the applied voltage $U_o=2$ mV, then the time required to reach $U_s$ is 0.693 mSec, while the time required is only 0.005 mSec, if $U_o=200$ mV.

Figure 3:
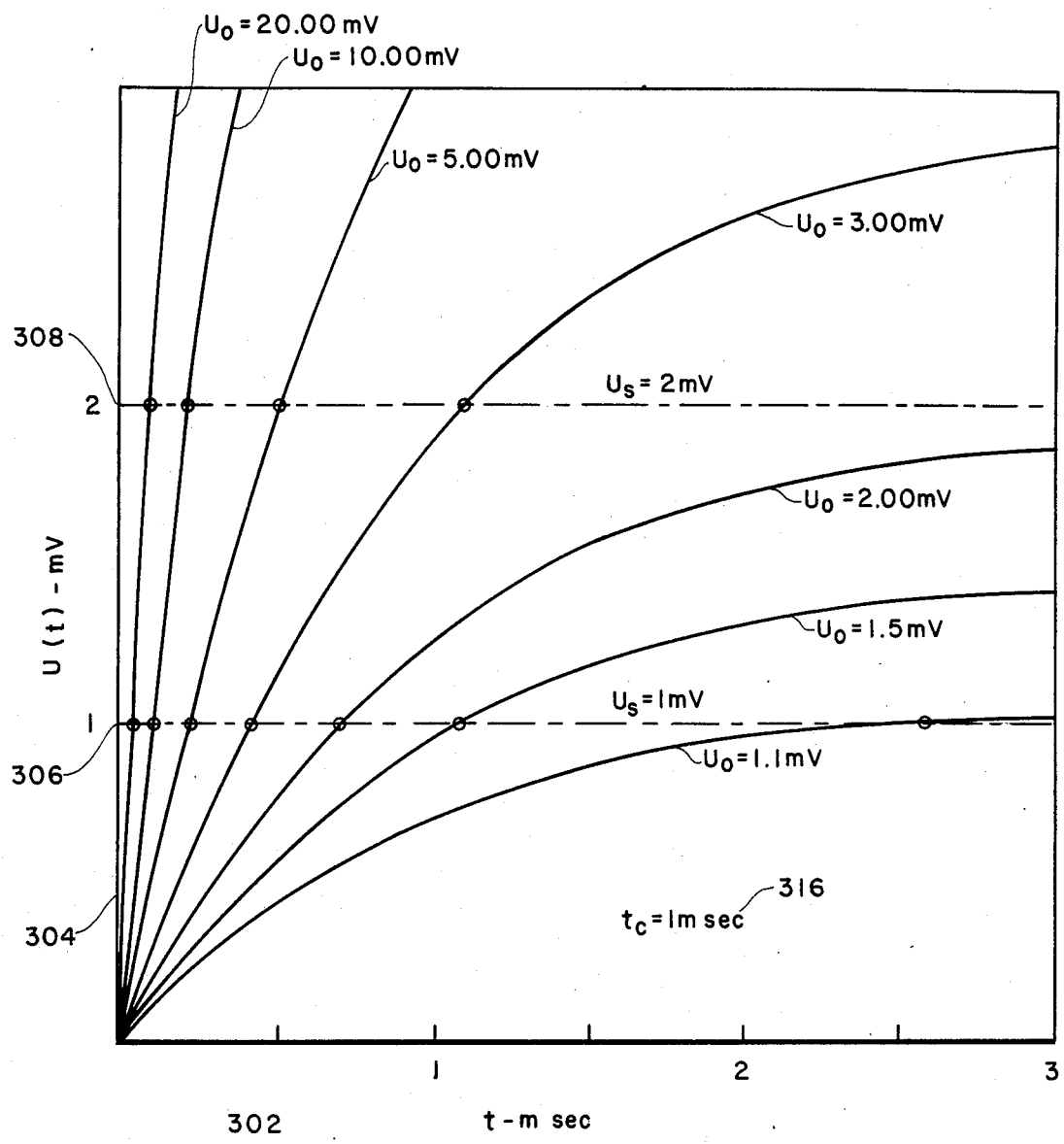
FIG. 3 is a family of curves illustrating signal relationships achieved with the FIGS. 1 and 2 apparatus.

FIG. 3 shows a family of curves relating to the voltage across capacitor 214 and including two values of $U_s$; these curves describe the voltage $U(t)$ as a function of time, assuming the charging time constant $T_c$ is 1 mSec, and with $U_o$ being the parameter. In FIG. 3 the horizontal axis 302 represents the time in milliseconds for the voltage $U(t)$ to ultimately reach a number of $U_o$ values such as 1.1 mV and 3.0 mV assuming the charging time constant of 1 millisecond indicated at 316. In FIG. 3, values of $U(t)$ are shown on the vertical axis 304 and two particular values of $U(t)$, 1 millivolt and 2 millivolts are indicated at 306 and 308. As can be seen as long as $U_o$ is close to $U_s$ in value, small changes in $U_o$ create large changes in the time required to reach $U_s$ while if the voltage $U_o$ is considerably larger than $U_s$ the time required to reach $U_s$ changes very little for relatively large changes in $U_o$. In other words, the FIG. 3 curves illustrate the ability of the FIG. 2 apparatus to provide a non-linear input to output relationship in which small amplitude light signals are enhanced while large amplitude signals are deemphasized.

Finally, assuming capacitor charging to the voltage $U_s$ and a rapid discharge to zero volts, the number of discharging pulses (n) obtained for a certain $U_o$ is given by the equation $$n = \frac{t_n}{T_s} = \frac{t_n}{T_c} \frac{1}{\frac{U_o}{\ln(U_o - U_s)}} \quad (3)$$

where $t_n$ is the time interval between reset pulses, that is, the time between the clock setting the memory counter M1 back to zero in FIG. 2. In equation 3 the discharge times are neglected since $t_d$ is much less than $t_c$. This limits the validity of this equation to small values of n.

Figure 5A:
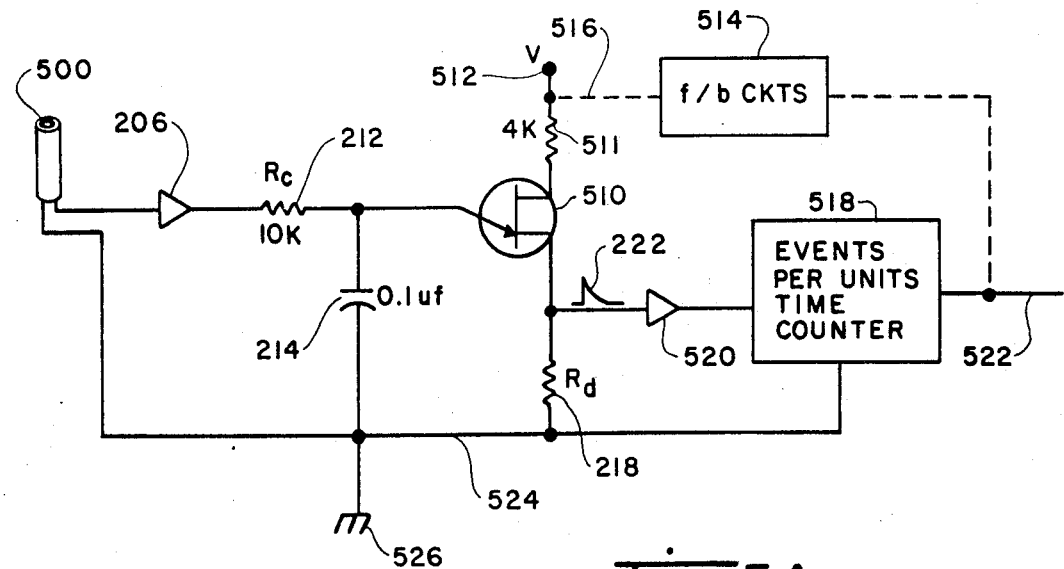
FIGS. 5a and 5b show alternate electrical schematic diagrams for parts of the FIG. 2 apparatus.

One practical arrangement for embodying the FIG. 2 circuit is shown in FIG. 5A of the drawings. The FIG. 5A apparatus includes a cylindrical transducer element 500 which corresponds to the transducer 204 in FIG. 2 and to one of the fiber transducer elements 136 in FIG. 1; FIG. 5 also shows several of the FIG. 2 elements including the amplifier 206, the charging resistor 212, the capacitor 214 and the discharging resistor 218. In FIG. 5 the electronic switch 216 is replaced with a unijunction transistor 510 and the pulse counter apparatus 202 is embodied for descriptive purposes as an events-per-unit time electronic counter 518. FIG. 5 also includes a source of dc voltage 512 used for energizing the unijunction transistor 510 and a feedback path 516 which includes feedback signal processing circuits 514. The FIG. 5 apparatus additionally includes a common ground bus 524 which is shown connected to ground 526. The output of the FIG. 5 circuit at 522 is a series of numerical values representing a history of the light received at the transducer 500.

Operation of the FIG. 5a circuit contemplates that a predetermined voltage is applied to the terminal 512; the magnitude of this voltage determines the trigger point of the transistor 510 according to the voltage divider characteristic of a unijunction transistor below triggering threshold. As is known in the semiconductor art, once the unijunction transistor base electrode is elevated to the level of the internal voltage divider node, a sudden decrease in transistor resistance occurs and the capacitor 214 is connected across the resistance 218. Below the trigger point, the voltage across the unijunction transistor is determined by current flow and the sizes of the resistors 511 and 218. These elements also determine the voltage at the internal voltage divider node prior to unijunction triggering.

The discharge current from the capacitor 214 flowing in the unijunction transistor produces a voltage pulse 222 across the resistance 218 in the manner explained for the resistance 218 in FIG. 2. The pulse 222 in FIG. 5a is similar in wave shape and other characteristics to the discharge pulse in FIG. 2. In FIG. 5a, this pulse is shown to be coupled to an amplifier 520 and then to an events-per-unit time counter 518 in order that the number of capacitor discharge triggerings of the unijunction transistor 510 be measured and presented as numerical values on the output signal bus 522. The events per unit time counter 518 may be embodied as a commercial laboratory instrument for purposes of illustration in FIG. 5; the two memory and clock embodiment of FIG. 2 is of course called for in the intended use environment for the FIG. 5 circuit where circuits of the size found on an integrated circuit chip are contemplated.

The numeric values illustrated for the resistors 212 and 218 and the capacitor 214 in FIG. 5a provide a charging time constant of 1 millisecond and a discharging time constant of 1/5 the length of the charging time constant; these values are in accordance with the example indicated in connection with FIG. 6 and may, of course, be varied as needed. The one-tenth microfarad value for capacitor 214 is too large for fabrication with present-day integrated circuit techniques; for such fabrication a capacitor value one/one-hundredth or one-/one-thousandth or less of this one-tenth microfarad size together with a 100 or 1000 fold increase in the value of resistor 212 would be more appropriate; a corresponding increase in the value of the discharging resistor 218 is also appropriate for such a charging time constant.

The unijunction transistor 510 in FIG. 5a is most conveniently operated with triggering voltages of several volts; in comparison with the millivolt values described for circuit operation above; this characteristic can be accommodated in the FIG. 2 and FIG. 5A embodiments of the invention by increasing the gain of the amplifiers 206 and 520.

Figure 5B:
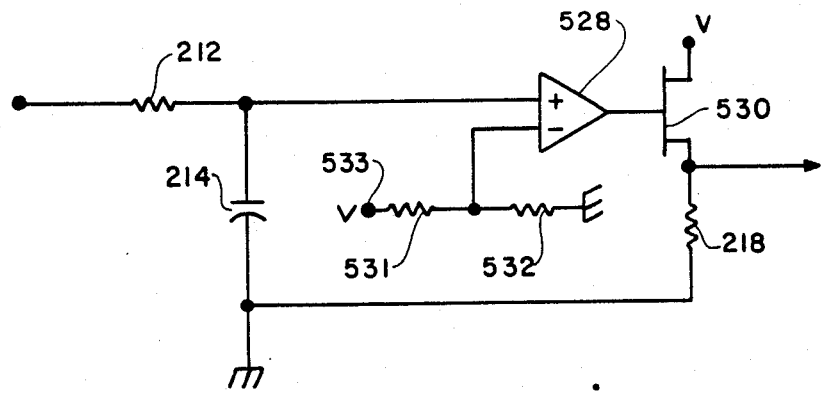

An alternate arrangement for the unijunction transistor 510 in FIG. 5A is shown in FIG. 5B. In this alternate arrangement a decision threshold circuit such as an operational amplifier configured without the usual negative feedback network may be employed to sense the occurrence of triggering point voltage across the capacitor 214 and thereupon initiate conduction in a field effect transistor 530. The voltage at which the decision threshold circuit 528 initiates field effect transistor conduction is determined by the selection of values for the resistors 531 and 532 and the voltage applied at terminal 533 as is known in the electronic circuit art. The FIG. 5B circuit arrangement allows use of the millivolt values shown in FIG. 3 of the drawings since the decision threshold circuit 528 can easily be arranged with commercially available circuits to respond to voltages of this magnitude. The resistors 531 and 532 tailor the trigger point of the threshold circuit to a desired value. Both the operational amplifier 528 and the field effect transistors 530 may be fabricated in integrated circuit form according to the present state of the integrated circuit art so that the FIG. 5B circuit in combination with the two memory configuration of the counter apparatus 202 in FIG. 2 provides a fully integratable arrangement capable of being located with the transducer elements and lens elements shown in FIG. 1.

Figure 4A:
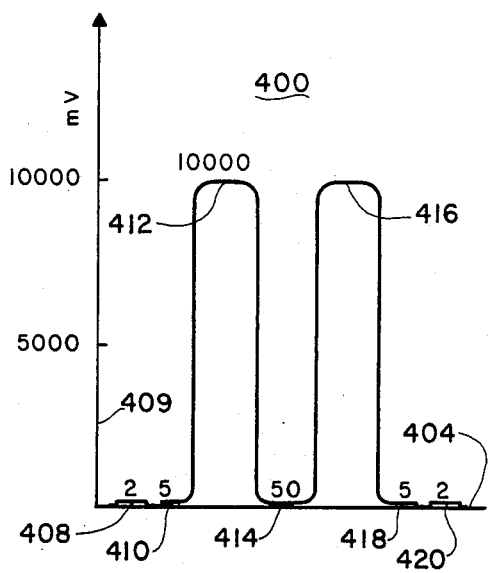
FIGS. 4a and 4b show an example of image information processed with the FIGS. 1 and 2 apparatus.
Figure 4B:
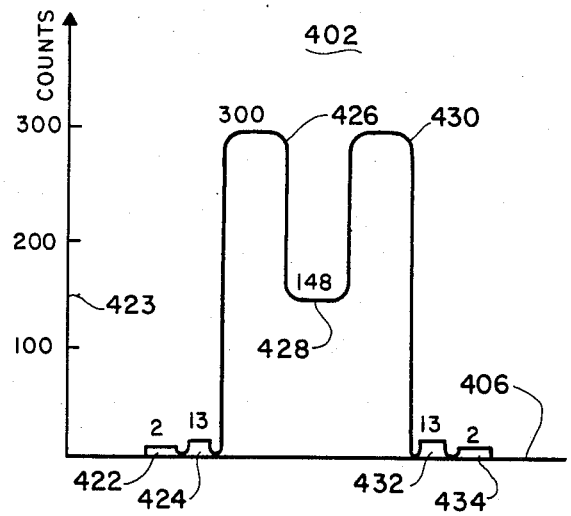

A use of the described apparatus to enhance the contrast of objects in a viewed scene is shown in FIG. 4 of the drawings, including the Views 4A and 4B. In FIG. 4, waveforms illustrating the input and output signals of the disclosed apparatus as a result of scanning a scene that is lighted by an automobile are shown. The waveform at 400 in FIG. 4A indicates the signal developed by a single transducer element while scanning light from the automobile and the waveform at 402 in FIG. 4B indicates the output signal of the FIG. 2 or FIG. 5 apparatus as a result of the automobile scanning example.

In the waveform 400 in FIG. 4A the peaks 412 and 416 represent light from the headlamps of the automobile while the valley at 414 represents the light intensity null between the headlamps, and the two shoulder values 410 and 418 represent light from the running lamps located adjacent the headlamps. The low intensity peaks at 408 and 420 represent pedestrians illuminated weakly by the automobile. The horizontal axes 404 and 406 in FIG. 4 represent time within the scan which produces the waveforms 400 and 402, the vertical axis 409 represents signal input values in millivolts while the vertical axis 423 represents signal output in terms of counts per unit of time.

The signals representing light intensity in FIG. 4A are shown to have amplitudes of 10,000 millivolts for the headlamp areas at 412 and 416, 50 millivolts for the null area between headlamps at 414, 5 millivolts for the running lamp areas at 410 and 418 and 2 millivolts for the pedestrians at 408 and 420. The waveform at 400 in FIG. 4A is obviously distorted with respect to amplitude presentation since in a linear display capable of indicating intensity signals of 10,000 units, intensity signals of 50, 5 and 2 units should not be visible. Two units, for example, in such a linear display, would have an amplitude of only 0.02% of the 10,000 unit peak and a linear indication is not so accurate as to be capable of 0.02% resolution.

The results of processing the FIG. 4A waveform values using equation (3) above and the FIG. 1 and FIG. 5 apparatus is shown at 402 in FIG. 4B. In FIG. 4B the peaks and other features of the waveform 402 correspond to the features described for the FIG. 4A waveform 400. The axis 423 in FIG. 4B corresponds with the axis 409 in FIG. 4A but is scaled in counts rather than millivolts; counts in FIG. 4B represent discharge events for the capacitor 214 in FIG. 2. The most notable differences between the waveforms 402 and 400 include the relatively enhanced amplitudes of the low level signals at 422, 424, 432, 434 and 428 and the relatively diminished amplitude of the peaks 426 and 430. In the waveform 402 the 2 millivolts caused by the pedestrian is now 2 counts or 0.67% of the 300 count peak value and is therefore within the accuracy of the vertical scale 423. With the processing of the waveform 402 the 5 millivolt running light peak has now become 13 counts and the 50 millivolt valley between headlights has become 148 counts. As can be seen, the low intensity values in the waveform 402 have become exaggerated and therefore discernable in the system output signal.

Saturation of the FIGS. 2 and 5 circuits may be said to occur when the time required to charge the capacitor 214, the time $t_s$, becomes as short as the time for discharging the capacitor through the resistor 218. The feedback circuit 514 in FIG. 5 can be employed to automatically set the voltage $U_s$ in such a manner that such saturation is avoided. According to this arrangement, the feedback circuit 514 is used to change the trigger voltage $U_s$ once the memory M1, 224 in FIG. 2, achieves a maximum acceptable count. The increased value of $U_s$ resulting from such a feedback arrangement results in a decreased system sensitivity and automatic light adaptation.

The capacitor used for signal accumulation or storage in the above description of the invention is in a broad sense typical of other storage arrangements which might be employed with the invention. It is well known in the electrical art for example that an inductor, another reactive component, may be used to accumulate energy in a manner relating to the accumulation of charge by the capacitor 214. The time constant which was mathematically defined as the product of capacitor and resistor electrical sizes for the capacitor embodiment becomes the quotient of inductance value divided by resistance value for an embodiment employing an inductor. Inductors have not found great acceptance in the present state of the integrated circuit art because of their physical size and capability for large voltage development during energy release, however this status may change with continued evolution of the integrated circuit art.

It is notable that the present invention provides for signal processing that resembles that of the human eye. In addition to very high resolution, the human eye is known to have a logarithimic sensitivity characteristic that is capable of detecting small changes in contrast at low light levels while also being capable of handling large intensities. This large dynamic range of the human eye in known as the eber-Flechner Law (about 1890). The present processing system wherein light signals are correlated with a number of pulses per unit time is also in accordance with biological systems wherein nerve pulses have substantially the same voltage amplitude and differ primarily as to the number of pulses occurring in a time interval. This characteristic of the disclosed apparatus could be useful, for example, in light sensors which operate in conjunction with bio systems in the manner which is now being accomplished with computer stimulation of muscles to allow spinal cord injury patients to walk.

The ability to logarithmically process light related signals in close physical proximity to a fly's eye lens and transducer apparatus and to achieve this processing in the form of cellular integrated circuits is useful in military and similar imaging systems. The saving of electronic system space and a reduced susceptibility to electrical interference signals also innure from use of the present processing system. The present system also eliminates a need for the conventional analog-to-digital converter circuit in a light responsive system and enables attaining in an optical apparatus the significantly increased reliability and improved failure rate that have become common in the integrated circuit art.

While the apparatus and method herein described constitute a preferred embodiment of the invention, it is to be understood that the invention is not to be limited to this precise form of apparatus or method and that changes may be made therein without departing from the scope of the invention which is described in the appended claims.

I claim:

1. Fly eye detector apparatus comprising the combination of:
    N apertured optical lens means for coupling transducer elements with a viewed scene, N being a first predetermined integral number greater than 1:
    optical to electrical retina means including an N plurality of solid state transducer cells each coupled with one of said N apertures and each containing an M plurality of transducer elements, M being a second predetermined integral number greater than 1, said cells of elements being located in the focal plane of said optical lens means for generating optically determined electrical signals;
    logarithmic electrical signal correlation means of at least $M \times N$ number of signal channels and located adjacent said transducer elements for converting said transducer electrical signals to electrical pulse signals, each channel of said signal correlating means including:
    electrical storage circuit means for logarithmically accumulating one of said transducer element electrical signals, said storage circuit means including a capacitor element and a charging current first electrical resistance element series connected therewith, the electrical sizes of said capacitor and charging current first resistance element being related according to a predetermined first electrical time constant;
    electrical switch means closable in response to attainment of a predetermined voltage across said capacitor element for discharging said capacitor element;
    a second electrical resistance element connected in series with said switch means and capacitor element for generating a capacitor discharge pulse signal, the electrical size of said capacitor and said second resistance element being related according to a second electrical time constant;
    means for counting the number of said capacitor discharge pulses occurring during a predetermined time interval.

2. The apparatus of claim 1 wherein said discharging second time constant is substantially shorter than said charging first time constant.

3. The apparatus of claim 2 wherein said signal processing means is located on a common substrate with said retina means.

4. The apparatus of claim 3 wherein said electrical switch means includes a semiconductor device electronic switch.

5. The apparatus of claim 4 wherein said discharging second time constant is one-fifth of said charging first time constant.

6. The apparatus of claim 5 further including optical signal responsive feedback means for varying the capacitor element voltage at which said electronic switch closes.

7. The apparatus of claim 3 wherein said signal processing means is fabricated on an integrated circuit chip.

8. The apparatus of claim 7 wherein said integrated circuit chip is composed of silicon.

9. The apparatus of claim 1 wherein said optical lens means includes a plural array of adjacent lens elements each coupled to one of said transducer cells by a light transmitting member.

10. The apparatus of claim 1 wherein said M transducer elements are comprised of M light transmitting fibers each surrounded by a continuous layer of photosensitive film.

11. The apparatus of claim 1 wherein said M transducer elements are comprised of R light transmitting fibers each attended by S segregated photosensitive transducer elements where R and S are predetermined integral numbers and M is equal to the mathematical product of R and S.

12. The apparatus of claim 11 wherein said fibers are cylindrical in shape and said S photosensitive transducer elements are each dispersed over the circumference and length of said cylindrical fiber in accordance with a predetermined configuration.

13. Optical signal processing apparatus comprising:
    a light conducting cylindrical fiber member mounted on an integrated circuit substrate and located to receive viewed scene light energy at one end thereof and including a photosensitive light to electrical energy transducing film received on the cylindrical surface thereof;
    amplifier means located on said integrated circuit substrate member for increasing the magnitude of an electrical signal generated by said transducing film to a predetermined signal range;
    electrical reactive means for accumulating electrical energy at a rate determined by the instantaneous amplitude of said electrical signal and a reactive means accumulation time constant;
    dissipation means for dissipating said reactive means accumulated electrical energy in response to each attainment of a predetermined quantity of energy in said reactive means, said dissipation occurring at a rate determined by a dissipation time constant;
    means located on said integrated circuit substrate for counting and remembering the number of dissipating events occurring in a predetermined time interval, the number of remembered dissipating events being indicative of received scene light intensity and duration according to a predetermined non-linear relationship.

14. The apparatus of claim 13 wherein said electrical reactive means is a capacitor and wherein said accumulated electrical energy is in the form of voltage dependent charge stored in said capacitor.

15. The apparatus of claim 14 wherein said dissipation means includes a voltage sensitive electronic switch.

* * * * *